(12) United States Patent
Miyakawa et al.

(10) Patent No.: US 8,205,327 B2
(45) Date of Patent: Jun. 26, 2012

(54) METHOD FOR MANUFACTURING CIRCUIT BOARD ON WHICH ELECTRONIC COMPONENT IS MOUNTED

(75) Inventors: Hidenori Miyakawa, Osaka (JP); Atsushi Yamaguchi, Osaka (JP); Kazuhiro Nishikawa, Osaka (JP); Kunio Hibino, Osaka (JP)

(73) Assignee: Panasonic Corporation, Osaka (JP)

( * ) Notice: Subject to any disclaimer, the term of this patent is extended or adjusted under 35 U.S.C. 154(b) by 901 days.

(21) Appl. No.: 12/094,219

(22) PCT Filed: Nov. 13, 2006

(86) PCT No.: PCT/JP2006/322555
§ 371 (c)(1),
(2), (4) Date: Nov. 5, 2008

(87) PCT Pub. No.: WO2007/058142
PCT Pub. Date: May 24, 2007

(65) Prior Publication Data
US 2009/0070994 A1    Mar. 19, 2009

(30) Foreign Application Priority Data

Nov. 21, 2005   (JP) .................................. 2005-335222

(51) Int. Cl.
*H05K 3/30* (2006.01)
(52) U.S. Cl. ................ 29/832; 29/830; 29/831; 29/852; 29/623.4
(58) Field of Classification Search .................... 29/832, 29/852, 830, 831, 846, 847, 825, 623, 4; 430/260, 261, 290, 276.1, 275.1, 278.1; 156/659, 156/656, 275.5, 275.7, 778, 783
See application file for complete search history.

(56) References Cited

U.S. PATENT DOCUMENTS

| | | | | |
|---|---|---|---|---|
| 5,024,880 A | * | 6/1991 | Veasley et al. | 428/317.5 |
| 5,378,298 A | | 1/1995 | Williams et al. | |
| 5,798,015 A | * | 8/1998 | Nohr et al. | 156/275.5 |
| 5,853,957 A | * | 12/1998 | Yanagawa et al. | 430/280.1 |
| 6,395,124 B1 | * | 5/2002 | Oxman et al. | 156/275.5 |

FOREIGN PATENT DOCUMENTS

| | | |
|---|---|---|
| JP | 2-82633 | 3/1990 |
| JP | 4-322439 | 11/1992 |
| JP | 7-118616 | 5/1995 |
| JP | 8-138773 | 5/1996 |
| JP | 11-256117 | 9/1999 |
| JP | 2000-86987 | 3/2000 |
| JP | 2003-204135 | 7/2003 |

OTHER PUBLICATIONS

International Search Report issued Dec. 12, 2006 in the International (PCT) Application PCT/JP2006/322555 of which the present application is the U.S. National Stage.

International Preliminary Report on Patentability together with English Translation of PCT Written Opinion of the International Searching Authority issued May 27, 2008 in the International (PCT) Application PCT/JP2006/322555 of which the present application is the U.S. National Stage.

* cited by examiner

*Primary Examiner* — Derris Banks
*Assistant Examiner* — Tai Nguyen
(74) *Attorney, Agent, or Firm* — Wenderoth, Lind & Ponack, L.L.P.

(57) ABSTRACT

A method for manufacturing a circuit board on which an electronic component is mounted, includes at least the steps of (a) supplying a liquid photo-polymerizable adhesive containing conductive particles dispersed therein to a surface of a printed board, to form an adhesive layer on the board surface; (b) irradiating the photo-polymerizable adhesive with ultraviolet light to turn into a gel, to provide adhesiveness to the adhesive layer; and (c) pressing the electronic component against the component mounting portion of the printed board from an upper surface side of the adhesive layer, to form an electrical connection between the electronic component and the component mounting portion, and in the method, the photo-polymerizable adhesive is a delayed reactive adhesive.

5 Claims, No Drawings

METHOD FOR MANUFACTURING CIRCUIT BOARD ON WHICH ELECTRONIC COMPONENT IS MOUNTED

BACKGROUND OF THE INVENTION

1. Field of the Invention

The present invention relates to a method for mounting an electronic component in which an adhesive layer having anisotropic conductivity is provided between a circuit pattern of a circuit board and electrodes of an electronic component.

2. Description of the Related Art

Conventionally, as one of technologies for joining an electronic component to a circuit pattern of a circuit board, a method has been carried out wherein an electronic component and a circuit board facing the component are thermally bonded with an anisotropic conductive material composed of an adhesive layer in which conductive particles are dispersed, and a conductive connection between a circuit wiring and the electrodes of the electronic component is formed as disclosed in Japanese Unexamined Patent Kokai Publication No. 8-138773. However, the method disclosed in the above Japanese Unexamined Patent Kokai Publication could not be used for the purpose of connecting a wiring board and an electronic component having insufficient heat resistance or connecting a member and a part having insufficient thermal-dimensional stability.

Then, a method for connecting an electronic component to a circuit board without heating it by use of an anisotropic conductive pressure-sensitive adhesive sheet material having stickiness has been developed. The method comprises, for example, sticking an anisotropic conductive post-photocurable type pressure-sensitive adhesive sheet material having stickiness on a board surface on which an electronic component is to be mounted; irradiating the adhesive sheet material with light to activate the curing reaction of the adhesive sheet material, followed by placing and pressing (or attaching) the electronic component onto the adhesive sheet material while the adhesive sheet material still keeps the stickiness; and promoting the curing reaction of the adhesive sheet material to securely bond them together, as disclosed in Japanese Unexamined Patent Kokai Publication No. 11-256117. Relating to the present invention, the stickiness may be referred to as tackiness or (pressure sensitive) adhesiveness. In accordance with the above method, it takes a considerable length of time until a desired mounting board is obtained, because it is necessary to cure the adhesive sheet material at a room temperature for a predetermined length of time until the curing reaction is completed after light irradiation, Further, when such a photocurable type anisotropic conductive pressure-sensitive adhesive sheet material is used, it is necessary to test whether or not an electrical connection has been actually formed between an electronic component and a circuit board with the pressure-sensitive adhesive sheet material in some cases. Such an inspection is to be carried out after the curing reaction requiring a predetermined time passage is completed. Thus, when a defect would be found in the inspection, the anisotropic conductive pressure-sensitive adhesive sheet material has been already cured, which makes it impossible to detach and join the electronic component again without breaking the board and the surface of the electronic component. Therefore, circuit boards which have been rejected in the inspection have been handled as defective products directly. Accordingly, it is impossible to readjust an electronic component attached to a circuit board at the stage of inspection, and the generation of some defective products has been one factor that causes a reduction in productivity.

Moreover, it can be expressed that, during the time immediately after light irradiation up to completion of a curing reaction, the electronic component attached onto the circuit board is not fixed onto the circuit board virtually, but is merely placed thereon for a relatively long time. Accordingly, after light irradiation, it is necessary to provide a place where the circuit board on which the electronic component being attached is temporarily stored or the curing reaction of the circuit board is completed and also a time period therefor. When a place where the circuit board is temporarily stored is located away from the place where light irradiation is carried out and/or where the electronic component is placed, it is further necessary to move the circuit boards to the located place by a carrying device such as a belt conveyer. At the time of conveying it, if the attached electronic component would had relatively large mass, and if a direction and a level of acceleration applied to the electronic component during conveying the circuit boards would vary discontinuously, problems involving that the electronic component attached onto the circuit board is displaced on the circuit board due to inertial force applied to the electronic component tend to occur. The displacement of an electronic component on a circuit board has been a great factor of a poor connection.

In Japanese Unexamined Patent Kokai Publication No. 2000-86987, an invention of a joining method which is capable of rejoining an electronic component joined onto a circuit board. This method is the same as the invention in the aforementioned Japanese Unexamined Patent Kokai Publication No. 11-256117, in that an anisotropic conductive photocurable type pressure-sensitive adhesive sheet material having stickiness is stuck on a board or an electronic component, and the adhesive sheet material is irradiated with light, and after a curing reaction is activated, the circuit board and the electronic component are securely bond together while the adhesive sheet material still keeps the stickiness. This method makes it possible to detach electronic components from the circuit board without breaking the surface of the board and the electronic component and rejoin the electronic component onto the circuit board by using a material comprising an acrylic polymer, a cationic polymerization compound, a photo cationic polymerization initiator, and conductive particles as a material for the pressure sensitive adhesive layer. However, the generation of the defect caused at the time of joining and the defect caused by conveying the board after light irradiation has not been sufficiently prevented according to the method disclosed in Japanese Unexamined Patent Kokai Publication No. 2000-86987.

SUMMARY OF THE INVENTION

Problems to be solved by the Invention

An object of the present invention is to solve the problems in the conventional techniques as mentioned in the above, and to provide a method for mounting an electronic component with high joint reliability. Namely, an object of the present invention is to provide a method for mounting an electronic component with extremely-high reliability, which is capable of fixing an electronic component in a pressure-bonding state, forming an anisotropic conductive connection, and carrying out an electrical inspection simultaneously, and the method for mounting an electronic component which is capable of curing an adhesive layer without applying thermal treatment thereto, which makes it possible to improve the reliability in electrical connection and which can be used for connecting a member and a part insufficient in heat resistance.

Means for solving the Problems

In a first aspect, the present application provides a method for manufacturing a circuit board on which an electronic component is mounted, the method includes at least the steps of:

(a) supplying a liquid photo-polymerizable adhesive containing conductive particles dispersed therein to a board surface including a component mounting portion of a printed board on which a predetermined pattern is provided, to form an adhesive layer on the board surface either in whole or in part;

(b) irradiating the photo-polymerizable adhesive with ultraviolet light to cause the adhesive to turn into a gel, thereby providing adhesiveness to the adhesive layer; and (c) placing and pressing the electronic component correspondingly against the component mounting portion of the printed board from the upper surface side of the adhesive layer, to form an electrical connection between the electronic component and the component mounting portion, wherein the photo-polymerizable adhesive is a delayed reactive adhesive.

The liquid photo-polymerizable adhesive in the present invention is an adhesive showing delayed reactivity, and has at least a composition containing the following photocurable resin and a photo-polymerization initiator. This delayed reactive photo-polymerizable adhesive is an adhesive having the characteristic that when the adhesive is irradiated with light (particularly ultraviolet light), the adhesive is not immediately cured in whole, but is partially cured by the light irradiation, and is turned into a gel state showing tackiness (stickiness or adhesiveness) in whole, and is capable of holding the gel state for a predetermined time period, for example, about several minutes to several tens of minutes (for example, one minute, two minutes, 5 minutes, or more, to 30 minutes, 60 minutes, 90 minutes, or less). Then, while the adhesive is showing the gel state, a curing reaction is gradually progressing within the adhesive, and after the predetermined time period passed, the curing of the entire adhesive is completed. From the standpoint that the adhesive is excellent in delayed reactivity, a resin having at least one cationic polymerization group in one molecule is preferably used as a photocurable resin in the present invention. As the resin having at least one cationic polymerization group in one molecule, for example, vinyl ether resin, epoxy resin, and the like may be cited as examples. Because the epoxy resin is excellent in stickiness, weatherability, chemical resistance, and heat resistance after curing, the epoxy resin is more preferably used.

Examples of the epoxy resin include, but are not limited to, a bisphenol A epoxy resin, a hydrogenerated bisphenol A epoxy resin, a bisphenol F epoxy resin, a novolak epoxy resin, an aliphatic cyclic epoxy resin, a brominated epoxy resin, a rubber-modified epoxy resin, an urethane-modified epoxy resin, a glycidyl ester compound, an epoxidated soybean oil, and an epoxidated elastomer. Those resins may be used alone or in combination.

There is no limitation to the photo-polymerization initiator, as far as it is activated by light irradiation, and is capable of inducing cationic polymerization. Preferably, a compound whose thermal catalyst activity is low at a temperature range of approximately 20 to 100° C. is preferable from the standpoint for improving the storage stability. Examples of such a preferable cationic photo-polymerization initiator include an iron-allene complex compound, an aromatic diazonium salt, an aromatic iodonium salt, an aromatic sulfonium salt and a pyridinium salt and the like.

As the photo-polymerization initiator, for example, there may be used commercially available compositions and products, such as Optomer SP-150 (manufactured by Asahi Denka Kogyo CO., LTD.), Optomer SP-151 (manufactured by Asahi Denka Kogyo CO., LTD.), Optomer SP-171 (manufactured by Asahi Denka Kogyo CO., LTD.), Optomer SP-170 (manufactured by Asahi Denka Kogyo CO., LTD.), UVE-1014 (manufactured by General Electric Company), CD-1012 (manufactured by Sartomer Company Incorporated), San-Aid SI-60L (manufactured by Sanshin Chemical Industry Co., Ltd.), San-Aid SI-80L (manufactured by Sanshin Chemical Industry Co., Ltd.), San-Aid SI-100L (manufactured by Sanshin Chemical Industry Co., Ltd.), CI-2064 (manufactured by Nippon Soda Co., Ltd.), CI-2639 (manufactured by Nippon Soda Co., Ltd.), CI-2624 (manufactured by Nippon Soda Co., Ltd.), CI-2481 (manufactured by Nippon Soda Co., Ltd.) and RHODORSIL PHOTOINITIATOR 2074 (manufactured by Rhone-Poulenc Japan, Ltd.).

The above-described photo-polymerization initiator may be used alone or in combination of two or more. Moreover, in order to promote polymerization, a photosensitization agent, for example, a thioxanthene derivative compound may be appropriately used in combination.

Examples of the conductive particles of the present invention include, but are not limited to, a metal such as gold, silver, copper, nickel, palladium, platinum, cobalt, rhodium, iridium, iron, ruthenium, osmium, aluminum, zinc, tin, or lead is singularly formed into particles, an alloy of two or more types of metals selected from the above metal group is formed into particles, a metal oxide such as tin oxide is formed into particles, a conductive carbon such as carbon is formed into particles, particles in which conductive metal is coated onto surfaces of insulating particles such as glass, carbon, mica and plastic. Further, two or more types of the above-described conductive particles may be used in combination.

An average particle size of the conductive particles is not particularly limited. However, it is preferably within a range from 1 to 20 μm. When the average particle size is less than 1 μm, the cohesion force among the conductive particles is extremely high, which makes it difficult to uniformly disperse the conductive particles in the liquid photo-polymerizable adhesive. On the other hand, when the average particle size is greater than 20 μm, and when a microcircuit having narrow pitches of approximately several tens of μm is joined, there is a high possibility to cause a short-circuit. Further, the particles having larger sizes tend to form sedimentation in the liquid photo-polymerizable adhesive, it is not easy to supply a uniform liquid photo-polymerizable adhesive.

A ratio at which conductive particles are blended with the photo-polymerizable adhesive is preferably set such that the conductive particles of 5 to 50 parts by mass with respect to the photo-polymerizable adhesive of 100 parts by mass. When it is less than 5 parts by mass, a problem is caused in joining, which has a tendency to easily generate a portion at which it is impossible to form an electrical connection, and when it is greater than 50 parts by mass, there is a high possibility to cause a short-circuit between wirings or terminals adjacent to one another of the circuit.

In accordance with the invention according to the first aspect of the present application, in one embodiment, it is possible to further carry out an inspection whether an electrical connection is formed between the electronic component and the component mounting portion in the step (c). It is because, depending on the application, it is required to carry out an electrical conduction inspection for the circuit board after the electronic component is mounted.

In the first aspect of the invention according to the present application, after the step (c), it is possible to further carry out a step (k) comprising irradiating at least the component mounting portion of the adhesive layer with ultraviolet light to promote the curing reaction of the photo-polymerizable adhesive. This operation may be carried out so as to irradiate the component mounting portion on which an electronic component is attached with ultraviolet light from obliquely above a corresponding electronic component. Further, after the step (k), it is possible to irradiate the entire adhesive layer with ultraviolet light to promote the curing reaction of the photo-polymerizable adhesive with respect to the adhesive layer in whole.

The ultraviolet light irradiations in and after the step (k) are operations for more rapidly curing the photo-polymerizable adhesive forming the adhesive layer in order to fix the electronic component attached to the board to the adhesive layer.

A photocurable resin, to which a photo-polymerization initiator has been added, starts the polymerization reaction (i.e., curing), when the photocurable resin is irradiated with light. It is possible to control a rate of polymerization reaction to various levels by adjusting the amount of irradiation energy or the composition of the photocurable resin. The photo-polymerizable adhesive of the present invention is an photo-curable type adhesive having delayed reactivity, and the composition of the adhesive has been adjusted to maintain its gel characteristics showing tackiness (stickiness or adhesiveness) for a predetermined time period, for example, several minutes to several tens of minutes, and to progress the curing reaction after the time passage by being irradiated with ultraviolet light at a predetermined amount of energy.

In another embodiment, after completion of the steps (a) to (c) according to the first aspect, it is possible to complete the curing of the photo-polymerization resin by allowing it to stand. When the curing is completed, the electronic component is fixed to the circuit board by the adhesive layer.

However, when it is desired to more rapidly complete the curing, after completion of the step (c), it is possible to carry out the second or later round of ultraviolet light irradiations (hereinafter called also the second and later round of ultraviolet light irradiations). The second and later round of ultraviolet light irradiations can be concentratedly carried out to the component mounting portion on which the electronic component is attached, which makes it possible to rapidly fix the electronic component. In that case, when the ultraviolet light irradiation is carried out from directly above the electronic component, the adhesive layer of the component mounting portion located beneath the electronic component is not directly exposed to ultraviolet light, which may not result in rapid curing. Then, provided that the ultraviolet light irradiation is carried out to the adhesive layer beneath the electronic component from obliquely above the electronic component, it is possible to rapidly cure the photocurable resin located beneath the electronic component.

Further, in an embodiment where the adhesive layer is formed on the board surface other than the component mounting portion, it is possible to carry out the second and later round of ultraviolet light irradiations to target the entire adhesive layer formed on the board surface. As a result, it is possible to rapidly cure the entire adhesive layer, which makes it possible to shorten the time required for manufacturing the circuit board on which the electronic component is mounted in whole. Depending on the composition of the photo-polymerizable adhesive and the amount of the dose of ultraviolet light irradiation, it is possible to simultaneously complete the fixation of the electronic component to the circuit board by irradiating the second and later round of ultraviolet light irradiations to the entire adhesive layer formed on the board surface without limiting the portions to be irradiated. In another embodiment where an adhesive layer is formed on the portion excluding the component mounting portion, and the adhesive layer is cured on the surface of the circuit board, it is possible to coat the surface of the circuit board with a layer of polymer material corresponding to the component of the photo-polymerizable adhesive. Although the coating thus formed contains conductive particles in its inside, the coating of the polymer material layer has a function as an insulating coating on the surface of the circuit board, for example, a resist coating material, since the conductive particles are trapped in a dispersed state in the layer of the polymer material.

The photo-polymerizable adhesive in which the conductive particles are dispersed, which is supplied in the step (a) of the present invention preferably has a viscosity of 300 Pa·s or less, preferably of 200 Pa·s or less, and more preferably of 100 Pa·s or less measured at a temperature of 25° C. as measured on a cone-plate viscometer. In the method for mounting an electronic component of the present invention, it is not preferable that the viscosity of the photo-polymerizable adhesive in which the conductive particles are dispersed is 300 Pa·s or more. It is because, when the viscosity of the photo-polymerizable adhesive is 300 Pa·s or more, it comes to be difficult to employ a typical method for applying a liquid material such as bar coating, spin coating, curtain coating, or roll coating in the procedure to apply the photo-polymerizable adhesive to the board surface. In addition, when the viscosity of the photo-polymerizable adhesive is 300 Pa·s or more, it is possible that the viscosity of the photo-polymerizable adhesive extremely increases upon irradiating the adhesive with ultraviolet light to be turned in a gel, and it comes to be difficult to push aside the adhesive when the electronic component is pressed against the component mounting portion of the wiring board, thereby a poor connection may be easily caused.

A second aspect in accordance with the present application provides a method for manufacturing a circuit board on which an electronic component is mounted, the method comprises at least the steps of:

(f) supplying a sheet-shaped material of a photo-polymerizable adhesive, which is obtained such that a delayed reactive photo-polymerizable adhesive containing conductive particles dispersed therein is irradiated with ultraviolet light so as to be turned into a gel;

(g) sticking the sheet-shaped material of a photo-polymerizable adhesive in desired size and shape to a board surface including a component mounting portion of a printed board on which a predetermined pattern is provided, to form an adhesive layer on the board surface in whole or in part; and (h) pressing the electronic component against the component mounting portion of the printed board from an upper surface side of the adhesive layer, to form an electrical connection between the electronic component and the component mounting portion.

According to the invention of the second aspect, it is possible to prepare the printed board having an adhesive layer composed of the photo-polymerizable adhesive using a sheet-shaped material of a photo-polymerizable adhesive being turned into a gel, which material may be prepared at a place separated from the printed board, and the sheet-shaped material is placed and pasted on the surface of the printed board. The operation for attaching the electronic component to the printed board and the operation for carrying out the second and later round of ultraviolet light irradiations to the adhesive layer can be carried out in the same way as in the method of the invention according to the first aspect described above. In this case, when there is a sheet-shaped material having the structure and/or the characteristics which are the same as those of the above-described adhesive layer, it is possible to utilize the sheet-shaped material. Further, it is not only possible to omit the step of applying a liquid adhesive at a site for manufacturing circuit boards by using such a sheet-shaped material, but also possible to attain advantageous effects which are the same as those by the method of the invention according to the first aspect described above.

EFFECT OF THE INVENTION

In accordance with the method of the present invention, it is possible to form an electrical connection (or electrical conductive path) between the electronic component and the circuit board by placing and pressing an electronic component against the circuit board, while the adhesive layer showing tackiness being turned into a gel state is provided on the board surface on which a component is to be mounted. Further, when an electrical conduction level obtained by an electrical conduction inspection is low, it is possible to detach and attach the electronic component again, or to adjust a level or a position at which the electronic component is pressed against (or thrust in) the adhesive layer. Accordingly, it is possible to effectively prevent the generation of a defective products due to poor electrical conduction, which makes it possible to manufacture a circuit board on which the electronic component is mounted. In this way, the conductive adhesive layer used in the present invention can be used as an anisotropic conductive film in its gel state, and on the other hand, after the conductive adhesive layer is cured, the conductive property is lost, and the conductive adhesive layer serves as an insulating coating (or a resist coating material) to coat the circuit board surface.

Further, provided that ultraviolet light is used for curing the adhesive, it is possible to prevent the electronic component and the circuit board from being heated. Accordingly, it is not only possible to connect a member and a part insufficient in heat resistance, but also possible to prevent the generation of warpage due to a difference between the rates of thermal expansion of the electronic component and the circuit board. Further, it is possible to firmly adhere the electronic component to the circuit board while retaining the electrical conduction between the electronic component and the circuit board after curing. Accordingly, the method of the present invention can be used as a method for mounting an electronic component with extremely-high reliability.

DETAILED DESCRIPTION OF THE PREFERRED EMBODIMENTS

First Embodiment

Hereinafter, a method for mounting an electronic component of the present invention will be described in detail.

As a photo-polymerizable adhesive, an epoxy resin (trade name: EPICOAT 828, manufactured by Yuka Shell Epoxy Co., Ltd.) of 100 g, a cationic photo-polymerization initiator (trade name: Optomer SP-170 (manufactured by Asahi Denka Kogyo Co., Ltd.) of 3.0 g, and silver powder (whose average particle size is 15 μm) serving as conductive particles of 20 g are provided and introduced to a ball mill to obtain a liquid photo-polymerizable adhesive in a uniform dispersion state.

The obtained liquid photo-polymerizable adhesive is applied onto a surface of a printed wiring board of 50 mm×20 mm in size.

A typical method, which can be used for applying liquid material, such as bar coating, spin coating, curtain coating, or roll coating can be used for the coating method. Further, when the adhesive is applied onto a part of the printed board, a print process such as screen process printing may be used. Further, because the liquid adhesive in the present invention has a low degree of viscosity of 300 Pa·s or less, it is possible to supply and apply the adhesive to only a narrow region and/or a desired region by use of a dispenser. Accordingly, it is possible to form an adhesive layer on the entire surface of the circuit board, and it is possible to form an adhesive layer only on a desired region so as to correspond to a pattern provided on the circuit board. It is preferable that the thickness of the adhesive layer is from 10 μm to 100 μm, and the thickness can be optimized according to a required performance.

Then, a first ultraviolet light irradiation to the coated adhesive to turn the adhesive into a gel is carried out. A typical high-pressure mercury lamp and the like can be used as a light source. It is appropriate that the irradiation level is from 10 to 500 mJ/cm$^2$. The irradiation level can be optimized according to a state of gelation.

Then, a chip type electronic component such as a resistance or a capacitor is mounted by an electronic component mounting machine. Namely, the electronic component is pressed against a component mounting portion of the printed wiring board. By the operation to press the electronic component against it, the electronic component is thrust in the gelled adhesive layer. Provided that the electronic component is thrust in the adhesive layer while being in a gel state, the adhesive layer is compressed in a direction in which the electronic component is thrust in the adhesive layer, i.e., in the thickness direction of the adhesive layer, and it is possible to bring the conductive particles in the adhesive layer into contact with one another in the thickness direction of the adhesive layer. Further, on the upper side surface of the adhesive layer, it is possible to form a contact state between the electronic component thrust in and the conductive particles in the vicinity of the upper side surface. On the other hand, on the lower side surface of the adhesive layer, it is possible to form a contact state between a land (or a point of contact) at the side of the component mounting portion of the circuit board and the conductive particles as the adhesive layer is compressed. Accordingly, it is possible to selectively form an electrical connection between the electronic component and the circuit board in the thickness direction of the adhesive layer, namely, it is possible to form an anisotropic conductive connection.

After an electrical connection is formed between the electronic component and the component mounting portion of the circuit board, the second and later round of ultraviolet light irradiations are carried out. When the ultraviolet light irradiations are carried out so as to target the component mounting portion on which the electronic component is attached, it is mainly possible to rapidly fix the electronic component to the circuit board.

When the electronic component is not transparent for ultraviolet light, a shadow portion which is not exposed to ultraviolet light may be generated in the adhesive layer. Then, it is possible to prevent the generation of shadow by irradiating ultraviolet light from obliquely above the electronic component. Even when a light source is in any form of a point light source, a line light source, and a surface light source, it is possible to irradiate ultraviolet light without generating shadow by moving the light source relative to the circuit board. Further, it is possible to effectively carry out ultraviolet light irradiation so as to prevent the generation of shadow without moving the light sources relative to the circuit board, provided that two or more types of light sources selected from a group of a point light source, a line light source, and a surface light source are combined, and the light sources are disposed so as to surround the respective electronic components attached to the component mounting portion so as not to generate shadow portions, which portions are not directly exposed to ultraviolet light radiated from the light sources, in the adhesive layer. It is appropriate that the irradiation level is from 100 to 1000 mJ/cm$^2$ for the present invention. The irradiation level can be optimized according to a joint state.

Further, since the liquid adhesive of the present invention has a delayed reactive photo-polymerizability, curing reaction progresses even in the shadow portions which have not been directly exposed to ultraviolet light with the passage of time. Thus, sufficient curing reaction progresses in the shadow portions after a predetermined time period passes, and the attained hardness of the adhesive in the shadow portions comes to substantially the same as that of the portion directly exposed to ultraviolet light. Accordingly, even when it is impossible to completely prevent the generation of shadow at the time of ultraviolet light irradiation, there is no problem particularly for the mounting reliability after the curing reaction is completed.

Further, in the present invention, an electrical connection is inspected while pressing a chip type component. Because a portion for holding an electronic component of the electronic component mounting machine is equipped together with an inspection probe, it is possible to fix the chip type component while checking that an electrical conduction is secured, which makes it possible to carry out mounting with extremely-high joint reliability. Further, when a circuit board having a poor conductivity or such failure is found, it is possible to correct the mounting state or position, while the adhesive layer is still in a gel state. Accordingly, it is possible to prevent the generation of defective products due to defective electrical conduction.

Further, it is possible to carry out a second or later ultraviolet light irradiation depending on the necessity. By such ultraviolet light irradiation, it is possible to further promote photo-curing reaction of the adhesive layer in a gel state, which is formed on a place excluding the component mounting portion on which the electronic component is attached on the surface of the circuit board. By such ultraviolet light irradiation, it is possible to cure the surface of the adhesive layer, which makes it possible to perform a function as a resist coating agent. The irradiation level from 100 to 1000 mJ/cm$^2$ is appropriate. The irradiation level can be optimized according to the situation.

In this way, in accordance with the mounting method of the present invention, by fixing the electronic component in a crimping state, it is possible to achieve an anisotropic conductive connection, and at the same time, it is possible to carry out an electrical inspection.

Because the adhesive layer can be cured without applying heating treatment, it is possible not only to improve the reliability in the electrical connection, but also to realize the method for mounting an electronic component with extremely-high reliability, which can be used for connecting members and components insufficient in heat resistance.

Hereinafter, the method for mounting an electronic component of the present invention will be described in more detail.

Example 1

As a photo-polymerizable adhesive, 100 g of an epoxy resin (trade name: Epicoat 828 manufactured by Yuka Shell Epoxy Co., Ltd.), 3.0 g of a photo cationic polymerization initiator (trade name: Optomer SP-170 manufactured by Asahi Denka Kogyo Co., Ltd.), and 20 g of silver powder (whose average particle size is 15 μm) serving as conductive particles were and then treated by a ball mill to obtain liquid photo-polymerizable adhesive in a uniform dispersion state. The obtained liquid adhesive had viscosity of 10 Pa·s.

The viscosity was measured at 25° C. using an E type viscometer, and an indicated value on the second cycle was read. The obtained liquid photo-polymerizable adhesive was applied onto the entire surface of the printed wiring board having a size of 50 mm by 20 mm and a thickness of 50 μm using a bar coating method.

A first ultraviolet light irradiation was carried out by irradiating ultraviolet light to the entire surface of the printed wiring board under the condition of the irradiance level of 200 mJ/cm$^2$ with using a high-pressure mercury lamp, and tackiness (adhesiveness) was developed on the surface.

Then, a second ultraviolet light irradiation was carried out by irradiating ultraviolet light to the portion of the printed wiring board, on which the chip type component is mounted, under the condition of the irradiance level of 800 mJ/cm$^2$ from obliquely above the both sides of the chip type component with using an optical fiber, while pressing the electrode portions of the chip type resistance against the circuit wiring of the printed board with a load of 20 g. At this time, the probe has been pressed against the circuit wiring of the printed board and the electrode portions of the chip type resistance, and confirmed that an electrical conduction path is formed at a required level (i.e. several mΩ to several tens of mΩ, for example, 1 mΩ, 2 mΩ, 3 mΩ or more to 10 mΩ, 30 mΩ, 50 mΩ or less), and then the ultraviolet light irradiation was carried out.

When the adhesive strength of the fixed chip type resistance was measured, it was 100 kg/cm$^2$, and the chip type resistance was fixed with sufficient adhesive force. As a result of testing 100 chip type components, all the chip type components denoted adhesive strengths which are greater than or equal to 100 kg/cm$^2$.

The adhesive strength was measured according to the JIS-K-6850.

Next, a third ultraviolet light irradiation was carried out to the entire surface of the printed wiring board under the condition of the irradiance level of 800 mJ/cm$^2$. At this point in time, the tackiness of the surface was disappeared, and the circuit wiring excluding the mounting portion was covered with an insulating resin film.

Comparative Example 1

As Comparative Example 1, chip type resistances were mounted in the same way as in Example 1 except that the first ultraviolet light irradiation to the entire surface of the printed wiring board was omitted. When the adhesive strength was measured, 9 chip type resistances among the 100 chip type components denoted values less than 100 kg/cm$^2$, which have brought about variations.

Comparative Example 2

As Comparative example 2, chip type resistances were mounted in the same way as in Example 1 except that the second ultraviolet light irradiation to the chip type component mounting portion was omitted. When the adhesive strength was measured, 30 chip type resistances among the 100 chip type components denoted values which are less than 30 kg/cm$^2$, and the adhesive strengths of the remaining chip type resistances are less than or equal to 100 kg/cm², which did not denoted sufficient adhesive strengths.

In accordance with the method for mounting an electronic component of the present invention, it is not only possible to mount an electronic component without applying heating treatment, but also possible to carry out an electrical inspection simultaneously. The reliability in electrical connection thereof is extremely high, and the mounting method can be used for connecting a member and a component insufficient in heat resistance.

Provided that the method for mounting an electronic component of the present invention is used for connecting electronic components such as elements of CCD, hologram elements, and chip type components, it is possible to manufacture products having these elements and components, and boards on which those are mounted built-in, for example, DVDs, mobile telephones, portable audio and visual equipment, notebook personal computers, digital cameras, and the like.

What is claimed is:

1. A method for manufacturing a circuit board on which an electronic component is mounted, comprising:
    (a) supplying a liquid photo-polymerizable adhesive containing conductive particles dispersed therein to a board surface including a component mounting portion of a printed board on which a predetermined pattern is provided, to form an adhesive layer on the board surface either in whole or in part;
    (b) irradiating the photo-polymerizable adhesive with ultraviolet light to cause the adhesive to turn into a gel, thereby providing adhesiveness to the adhesive layer; and
    (c) placing and pressing the electronic component correspondingly against the component mounting portion of the printed board from an upper surface side of the adhesive layer, to form an electrical connection between the electronic component and the component mounting portion, wherein the photo-polymerizable adhesive is a delayed reactive adhesive,
    wherein, in the step (c), an inspection for electrical conduction between the electronic component and the component mounting portion is further carried out.

2. A method for manufacturing a circuit board on which an electronic component is mounted, comprising:
    (a) supplying a liquid photo-polymerizable adhesive containing conductive particles dispersed therein to a board surface including a component mounting portion of a printed board on which a predetermined pattern is provided, to form an adhesive layer on the board surface either in whole or in part;
    (b) irradiating the photo-polymerizable adhesive with ultraviolet light to cause the adhesive to turn into a gel, thereby providing adhesiveness to the adhesive layer; and
    (c) placing and pressing the electronic component correspondingly against the component mounting portion of the printed board from an upper surface side of the adhesive layer, to form an electrical connection between the electronic component and the component mounting portion, wherein the photo-polymerizable adhesive is a delayed reactive adhesive,
    wherein after the step (c), the method further comprises the step of
    (d) irradiating at least the component mounting portion of the adhesive layer with ultraviolet light from obliquely above a corresponding electronic component to promote a curing reaction of the photo-polymerizable adhesive.

3. The method for manufacturing a circuit board on which an electronic component is mounted according to claim 2, wherein, after the step (d), the entire adhesive layer is irradiated with ultraviolet light.

4. A method for manufacturing a circuit board on which an electronic component is mounted, comprising:
    (a) supplying a liquid photo-polymerizable adhesive containing conductive particles dispersed therein to a board surface including a component mounting portion of a printed board on which a predetermined pattern is provided, to form an adhesive layer on the board surface either in whole or in part;
    (b) irradiating the photo-polymerizable adhesive with ultraviolet light to cause the adhesive to turn into a gel, thereby providing adhesiveness to the adhesive layer; and
    (c) placing and pressing the electronic component correspondingly against the component mounting portion of the printed board from an upper surface side of the adhesive layer, to form an electrical connection between the electronic component and the component mounting portion, wherein the photo-polymerizable adhesive is a delayed reactive adhesive,
    wherein the photo-polymerizable adhesive supplied in the step (a) has a viscosity of 300 Pa·s or less measured on a cone-plate viscometer at a temperature of 25° C.

5. The method for manufacturing a circuit board on which an electronic component is mounted according to claim 1, wherein the photo-polymerizable adhesive consists primarily of at least one resin selected from the group of a vinyl ether resin and an epoxy resin is used.

\* \* \* \* \*